(12) United States Patent
Sano

(10) Patent No.: US 10,302,706 B2
(45) Date of Patent: May 28, 2019

(54) APPARATUS FOR CALCULATING STATE OF CHARGE OF STORAGE BATTERY

(71) Applicant: DENSO CORPORATION, Kariya, Aichi-pref. (JP)

(72) Inventor: Yuri Sano, Kariya (JP)

(73) Assignee: DENSO CORPORATION, Kariya (JP)

( * ) Notice: Subject to any disclaimer, the term of this patent is extended or adjusted under 35 U.S.C. 154(b) by 861 days.

(21) Appl. No.: 14/944,989

(22) Filed: Nov. 18, 2015

(65) Prior Publication Data

US 2016/0139207 A1 May 19, 2016

(30) Foreign Application Priority Data

Nov. 19, 2014 (JP) ................. 2014-234475

(51) Int. Cl.
*G01R 31/36* (2019.01)
*G01R 31/367* (2019.01)
*G01R 31/3842* (2019.01)

(52) U.S. Cl.
CPC ....... *G01R 31/367* (2019.01); *G01R 31/3842* (2019.01)

(58) Field of Classification Search
CPC .. G01R 31/396; G01R 31/3658; G01N 31/02; G01N 27/42
See application file for complete search history.

(56) References Cited

U.S. PATENT DOCUMENTS

2012/0105009 A1* 5/2012 Yao ................... G01R 31/3662
320/134
2016/0226249 A1* 8/2016 Sakuma ................. H02J 3/32

FOREIGN PATENT DOCUMENTS

JP 2010071703 A 4/2010
JP 2010210457 A 9/2010

* cited by examiner

*Primary Examiner* — Tung X Nguyen
(74) *Attorney, Agent, or Firm* — Oliff PLC

(57) ABSTRACT

In an apparatus, an OCV calculator measures a close circuit voltage (CCV) across an equivalent circuit of a storage battery, and calculates an open circuit voltage (OCV) across the storage battery based on the CCV, the equivalent circuit, and a current flowing through the storage battery. The equivalent circuit simulates an electrochemical behavior of the storage battery. The equivalent circuit includes the OCV as a power supply voltage and a predetermined internal impedance connected in series to the power supply voltage. The internal impedance includes a capacitance. A calculator calculates an SOC of the storage battery as a function of the OCV. A determiner determines whether the capacitance is saturated as a function of an electrical parameter associated with a charge stored in the capacitance. A diagnosing unit diagnoses whether the SOC of the storage battery is appropriate according to whether the capacitance is saturated.

10 Claims, 6 Drawing Sheets

APPARATUS FOR CALCULATING STATE OF CHARGE OF STORAGE BATTERY

CROSS REFERENCE TO RELATED APPLICATIONS

This application is based on and claims the benefit of priority from Japanese Patent Application 2014-234475 filed on Nov. 19, 2014, the disclosure of which is incorporated in its entirety herein by reference.

TECHNICAL FIELD

The present disclosure relates to an apparatus for calculating the state of charge, which includes, for example, the charging rate, of a storage battery.

BACKGROUND

There is a technology for calculating the state of charge (SOC) of a storage battery based on the correlation between an open circuit voltage (OCV) across the storage battery and the SOC of the storage battery.

Unfortunately, during charging or discharging of the storage battery, it is difficult to directly measure the OCV because a load is connected to the storage battery.

Another approach uses a close circuit voltage (CCV) across a storage battery based on an equivalent circuit, i.e. circuit model; the equivalent circuit equivalently simulates the electrical consequences of the chemical reactions inside the storage battery when a load is connected to the storage battery.

The equivalent circuit of the storage battery is comprised of an unknown OCV across the storage battery, and an internal impedance of the storage battery. The internal impedance of the storage battery is comprised of an internal resistance of the storage battery, and a parallel circuit of a polarization resistance and a capacitance, i.e. an electric double layer capacitance, of the storage battery, which are connected in parallel to each other. The OCV, the internal resistance, and the parallel circuit are connected in series. That is, the voltage across the equivalent circuit of the storage battery serves as the CCV across the storage battery.

Thus, calculating the, value of the CCV based on a predetermined value of the internal impedance during charging or discharging of the storage battery enables the unknown OCV to be calculated. The calculated OCV enables the SOC of the storage battery to be calculated.

SUMMARY

Continuous charging or discharging of the storage battery may cause the capacitance in the equivalent circuit of the storage battery to become saturated. This saturation may result in reduction of the reliability of the estimate of the SOC of the storage battery calculated based on the OCV across the storage battery.

In view of the circumstances set forth above, one aspect of the present disclosure seeks to provide an apparatus for calculating an SOC of a storage battery, which is capable of improving the reliability of the SOC of a storage battery calculated based on the OCV across the storage battery.

According to an exemplary aspect of the present disclosure, an apparatus is provided for calculating a state of charge of a storage battery. The apparatus includes an open-circuit voltage calculator configured to measure a close circuit voltage across an equivalent circuit of a storage battery, and calculates an open circuit voltage across the storage battery based on the measured close circuit voltage, the equivalent circuit, and a current flowing through the storage battery. The equivalent circuit simulates an electrochemical behavior of the storage battery. The equivalent circuit includes the open circuit voltage as a power supply voltage and a predetermined internal impedance connected in series to the power supply voltage. The internal impedance includes a predetermined capacitance. The apparatus includes a calculator configured to calculate a state of charge of the storage battery as a function of the open circuit voltage calculated by the open-circuit voltage calculator. The apparatus includes a determiner configured to determine whether the capacitance is saturated as a function of an electrical parameter associated with the charge stored in the capacitance. The apparatus includes a diagnosing unit configured to diagnose whether the state of charge of the storage battery calculated by the calculator is appropriate according to whether the capacitance is saturated.

The apparatus according to the exemplary aspect diagnoses whether the state of charge of the storage battery calculated by the calculator is appropriate according to whether the capacitance is saturated. This configuration enables the state of charge calculated by the calculator based on the open circuit voltage to be disregarded upon the capacitance being determined to be saturated. This therefore improves the reliability of the state of charge of the battery calculated based on the open circuit voltage across the storage battery.

Various aspects of the present disclosure can include and/or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENT

Figure 1:
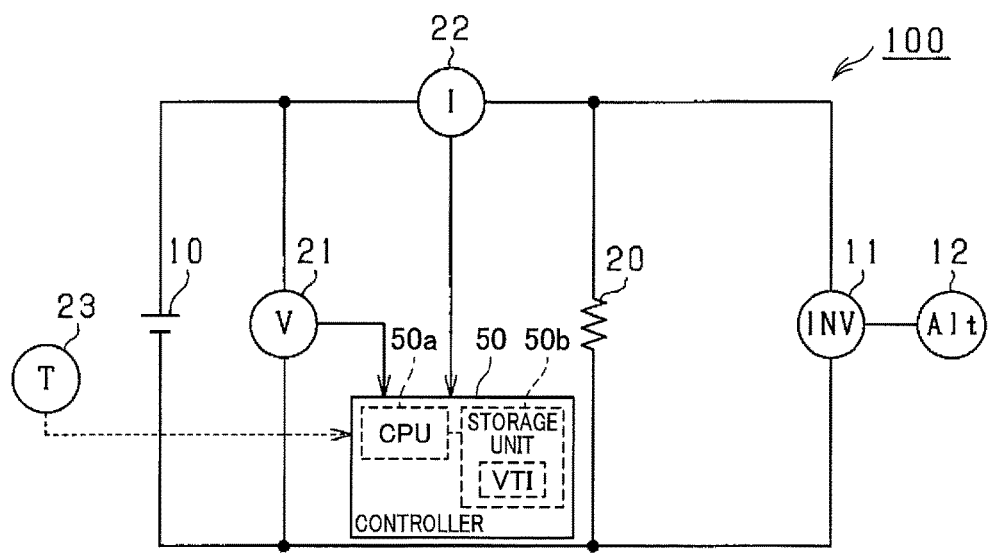
FIG. 1 is a circuit diagram schematically illustrating an example of the configuration of a battery system according to an embodiment of the present disclosure.

The following describes an embodiment of the present disclosure with reference to the accompanying drawings. In the drawings, identical reference characters are utilized to identify identical corresponding components.

FIG. 1 illustrates a battery system 100 according to this embodiment of the present disclosure, in which an apparatus for calculating the state of charge of a storage battery 10 according to this embodiment is incorporated. Note that the battery system 100 of this embodiment is capable of supplying power of the storage battery 10 to an external device such as an electric vehicle or a hybrid vehicle.

Referring to FIG. 1, the battery system 100 includes the storage battery 10, an inverter 11, a power generator 12, an electrical load 20, and various sensors.

The storage battery 10 is a rechargeable battery, such as a lithium-ion secondary battery. For example, the storage battery may be composed of a unit battery, i.e. a cell, or designed as a battery pack including a plurality of unit batteries, i.e. cells, connected in series.

Because the cells of the storage battery 10 are connected in series, the storage battery 10 can be regarded as one cell independently of the number of the cells. The following therefore describes the storage battery 10 comprised of one cell.

The storage battery 10, i.e. the cell, schematically includes a positive electrode, a negative electrode, and an electrolyte separating the positive electrode and the negative electrode. Electrochemical reactions take place in the electrolyte of the cell, resulting in a current flowing through a circuit connected to the storage battery 10.

The above-configured storage battery 10 inherently has an internal impedance.

The internal impedance includes, for example, an internal resistance including the resistances of the positive and negative electrodes and the resistance of the electrolyte. The internal impedance also includes at least one resistance-capacitance (RC) parallel circuit comprised of a pair of polarization resistance and a capacitance, i.e. an electric double layer capacitance, connected in parallel to each other. The at least one RC parallel circuit represents the loss resulted from the electrochemical reaction in the cell.

The storage battery 10 is connected to the power generator 12 via the inverter 11. The power generator 12 is capable of generating alternating-current (AC) power. The inverter 11 is capable of converting the AC power generated by the power generator 12 into direct-current (DC) power, and charging the storage battery 10 using the DC power. The storage battery 10 is also connected to the electrical load 20 for supplying power to the electrical load 20.

The various sensors are capable of measuring or detecting various physical characteristics of the storage battery 10. For example, the various sensors include a voltage sensor 21, a current sensor 22, and a temperature sensor 23.

The voltage sensor 21 is configured to measure a voltage V across the storage battery 10, and output a measurement signal indicative of the voltage V to the controller 50. The current sensor 22 is configured to measure a current I flowing through the storage battery 10, and output a measurement signal indicative of the current I to the controller 50. The temperature sensor 23 is configured to detect a temperature T of the storage battery 10, and output a measurement signal indicative of the temperature T to the controller 50.

The controller 50 includes, for example, a well-known microcomputer, which is composed of, for example, a CPU 50$a$, a storage unit 50$b$, and so on.

The storage unit 50$b$ stores various programs, i.e. various sets of instructions, including an SOC diagnostic routine. For example, the CPU 50$a$ can run the various programs to perform corresponding tasks.

The storage unit 50$b$ also stores various types of information VTI correlating with various characteristic parameters of the storage battery 10; the various characteristic parameters include the state of charge (SOC) of the storage battery 10. For example, the various types of information VTI include (1) Internal-resistance temperature characteristics of the storage battery 10

(2) The amount of charge Qmax stored in the storage battery 10 upon the storage battery 10 being fully charged (3) Internal-voltage temperature characteristics of the storage battery 10

(4) The correlations between a first SOC described later and the open circuit voltage (OCV) across the storage battery 10.

The controller 50, i.e. the CPU 50$a$, is capable of calculating the various characteristic parameters of the storage battery 10 based on the measurement signals output from the various sensors, and the various types of information VTI stored in the storage unit 50$b$.

Figure 2:
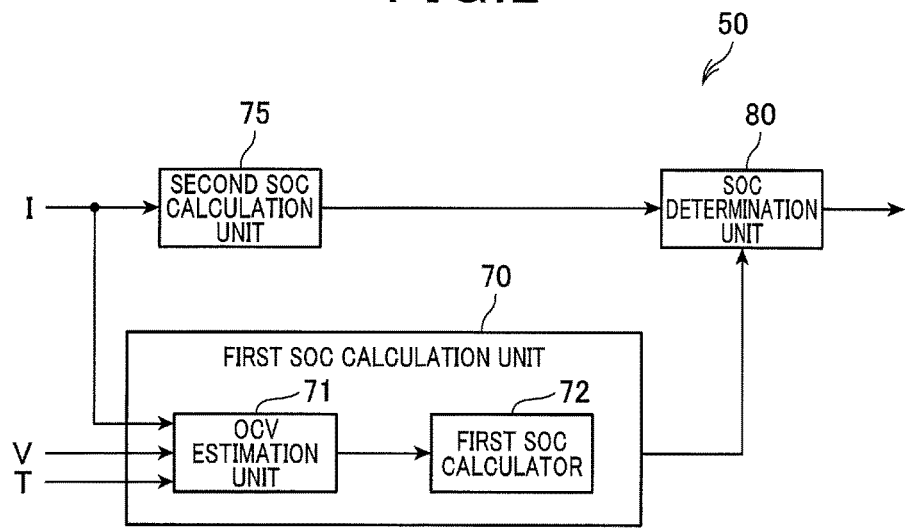
FIG. 2 is a functional block diagram schematically illustrating an example of a controller of the battery system illustrated in FIG. 1.

FIG. 2 schematically illustrates an example of the functional structure of the controller 50 according to the embodiment.

The controller 50 includes a first SOC calculation unit 70, a second SOC calculation unit 75, and an SOC determination unit 80. The controller 50, the voltage sensor 21, and the current sensor 22 for example serve as the apparatus for calculating the state of charge of the storage battery 10 according to this embodiment.

The first SOC calculation unit 70 is configured to calculate a first state of charge SOCv based on the voltage V measured by the voltage sensor 21. The voltage V measured by the voltage sensor 21 serves as the close circuit voltage (CCV) across the storage battery 10.

The second SOC calculation unit 75 is configured to calculate a second state of charge SOCi based on the current I measured by the current sensor 22.

The SOC determination unit 80 is configured to determine whether the first state of charge SOCv or the second state of charge SOCi is appropriate.

For example, the current sensor 22 repeatedly measures a value of the current I flowing therethrough for every predetermined period represented as dt. Based on the measured values of the current I for each predetermined period dt, the second SOC calculation unit 75 calculates a charge Q in the storage battery 10 in accordance with, for example, the following formula (A):

$$Q = \int I\,dt \tag{A}$$

Then, the second SOC calculation unit 75 calculates the second state of charge SOCi of the storage battery 10 for a current period N in accordance with the following formula (1):

$$SOCi(N)[\%] = SOCi(N-1) + 100 \times \int I\,dt / Q\max \tag{1}$$

Where SOCi(N−1) represents the second state of charge SOCi of the storage battery 10 calculated by the second SOC calculation unit 75 for the previous period (N−1), and Qmax represents the amount of charge stored in the storage battery 10 upon the storage battery 10 being fully charged. Note that the polarity of the current I is set to be negative when the storage battery 10 is discharged, and to be positive when the storage battery 10 is charged.

The first SOC calculation unit 70 includes an OCV estimation unit 71 and a first SOC calculator 72.

The OCV estimation unit 71 calculates, based on an equivalent circuit, i.e. an equivalent model, 90 of the storage battery 10, a value of the OCV across the storage battery 10.

Figure 3:
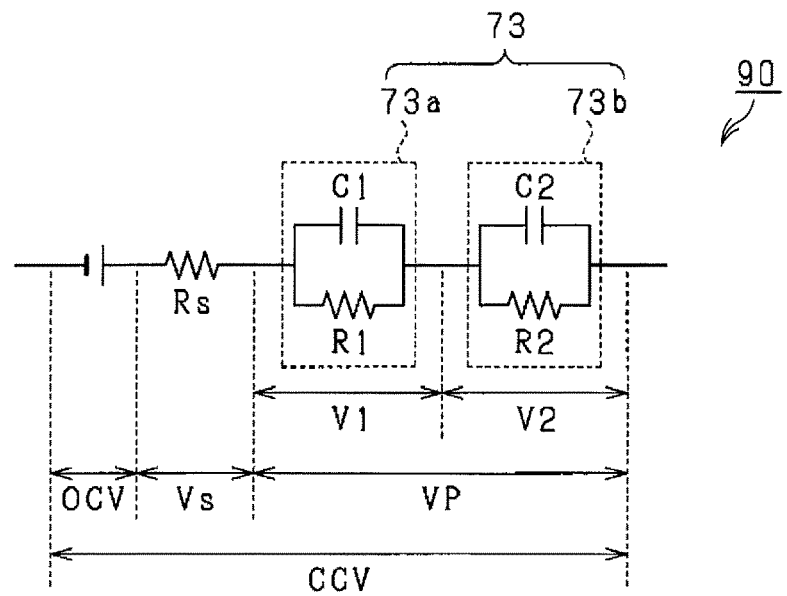
FIG. 3 is a circuit diagram schematically illustrating an example of the configuration of an equivalent circuit of a storage battery illustrated in FIG. 1 according to the embodiment of the present disclosure.

As shown in FIG. 3, the equivalent circuit 90 equivalently simulates the electrochemical behavior of the storage battery 10 when the electrical load 20 is connected to the storage battery 10.

Specifically, the equivalent circuit 90 includes a power source 13 having a terminal voltage matching with the OCV across the storage battery 10. The equivalent circuit 90 also includes the internal resistance of the storage battery 10, which is represented as reference character Rs, and the at least one RC parallel circuit, which is represented as reference numeral 73. The OCV, the internal resistance Rs, and the at least one RC parallel circuit 73 are connected in series to constitute the equivalent circuit 90.

As described above, the storage battery 10 inherently has at least one pair of a polarization resistance, i.e. reaction resistance, and an electric double layer capacitance. The reaction resistance and the electric double layer capacitance are based on, for example, reactions between ions in the electrolyte and electrical charges in each of the positive and negative electrodes. Because of the differences between the reactions, a plurality of RC parallel circuits, each of which is comprised of a polarization resistance and an electric double layer capacitance, based on the reaction differences can be used to estimate the electrochemical behavior of the storage battery 10 with higher accuracy.

Thus, the at least one RC parallel circuit 73 according to the embodiment consists of, for example, a first RC parallel circuit 73a and a second RC parallel circuit 73b connected in series to each other. The first RC parallel circuit 73a is comprised of a pair of polarization resistance R1 and a capacitance component, i.e. an electric double layer capacitance component, C1, connected in parallel to each other. The second RC parallel circuit 73b is comprised of a pair of polarization resistance R2 and a capacitance component, i.e. an electric double layer capacitance component, C2, connected in parallel to each other.

The first RC parallel circuit 73a has a time constant $\tau 1$, which is calculated by the produce of a value of the polarization resistance R1 and a value of the capacitance component C1. The second RC parallel circuit 73b has a time constant $\tau 2$, which is calculated by the product of a value of the polarization resistance R2 and a value of the capacitance component C2; the time constant $\tau 2$ being higher than the time constant $\tau 1$.

When the current I is flowing through the equivalent circuit 90 during charging or discharging of the storage battery 10, the CCV across the equivalent circuit 90 is represented by the following formula (2):

$$CCV = OCV + Vs + Vp \tag{2}$$

Where reference character CCV represents the closed circuit voltage (CCV) across the equivalent circuit 90, Vs represents a resistance voltage drop caused by the internal resistance Rs (i.e. Vs=Rs×1), and Vp represents a polarization voltage drop. The polarization voltage drop Vp is a voltage drop caused by the first parallel connection pair 73a and the second parallel connection pair 73b. Specifically, the polarization voltage drop Vp is to represented by the following formula Vp=V1+V2 where V1 represents a voltage across the first RC parallel circuit 73a, and V2 represents a voltage across the second RC parallel circuit 73b (see FIG. 3). That is, the polarization voltage Vp matches with the sum of the voltage V1 across the first RC parallel circuit 73a and the voltage V2 across the second RC parallel circuit 73b.

The voltage V1 across the first RC parallel circuit 73a is calculated based on a value of the polarization resistance R1, a value of the capacitance component C1, and a value of the current I measured by the current sensor 22. Similarly, the voltage V2 across the second RC parallel circuit 73b is calculated based on a value of the polarization resistance R2, a value of the capacitance component C2, and a value of the current I measured by the current sensor 22.

As described above, the internal-resistance temperature characteristics of the storage battery 10 are stored in the storage unit 50b as a part of the information VTI. For example, information indicative of the internal resistance Rs as a function of the temperature T of the storage battery 10 is stored in the storage unit 50b as the internal-resistance temperature characteristics of the storage battery 10. The OCV estimation unit 71 can refer to the information indicative of the internal resistance Rs as a function of the temperature T of the storage battery 10 using a value of the temperature T measured by the temperature sensor 23 to extract a value of the internal resistance Rs matching with the measured value of the temperature T. Then, the OCV estimation unit 71 can calculate a value of the resistance voltage drop Vs using the extracted value of the internal resistance Rs and a value of the current I measured by the current sensor 22.

In addition, the internal-voltage temperature characteristics of the storage battery 10 are stored in the storage unit 50b as a part of the information VTI. For example, first information indicative of the resistance voltage drop Vs as a function of the current I, a predetermined value of the internal resistance Rs, and the temperature T of the storage battery 10 is stored in the storage unit 50b as the internal-voltage temperature characteristics of the storage battery 10. Note that the value of the internal resistance Rs is defined as an initial value or measured beforehand, and the value of the internal resistance Rs is stored in the storage unit 50b.

The OCV estimation unit 71 can refer to the first information using a value of the temperature T measured by the temperature sensor 23 and the predetermined value of the internal resistance Rs, and a value of the current I measured by the current sensor 22.

Then, the OCV estimation unit 71 can extract, from the first information, a value of the resistance voltage drop Vs matching with the measured value of the temperature T, the predetermined value of the internal resistance Rs, and the measured value of the current I.

Second information indicative of the polarization voltage drop Vp as a function of the current I and the temperature T is stored in the storage unit 50b as the polarization-voltage temperature characteristics of the storage battery 10. Note that the values of the polarization resistance R1, the capacitance component C1, the polarization resistance R2, and the capacitance component C2 have been previously defined, measured, or estimated so that the function for the polarization voltage drop Vp with respect to the current I and the temperature T has been decided to be stored in the storage unit 50b.

The OCV estimation unit 71 can refer to the second information using a value of the temperature T measured by the temperature sensor 23 and a value of the current I measured by the current sensor 22. Then, the OCV estimation unit 71 can extract, from the second information, a value of the polarization voltage drop Vp matching with the measured value of the temperature T and the measured value of the current I.

The OCV estimation unit 71 calculates the OCV in the equivalent circuit 90 according to a value of the CCV across the storage battery 10 measured by the voltage sensor 21, the calculated resistance voltage drop Vs, and the polarization voltage drop Vp in accordance with the following formula (3):

$$OCV = CCV - (Vs + Vp) \qquad (3)$$

In the above formula, reference character CCV represents the CCV across the storage battery 10.

For example, the storage unit 50b stores OCV-SOCv map information (see FIG. 6) indicative of the correlations between the first state of charge SOCv and the OCV across the storage battery 10. That is, the first SOC calculator 72 refers to the map information indicative of the correlations between the first state of charge SOCv and the OCV across the storage battery 10 using the OCV calculated by the OCV estimation unit 71, thus extracting a value of the first state of charge SOCv matching with the calculated OCV.

Continuous charging or discharging of the storage battery 10 may cause each of the capacitance components C1 and C2 in the equivalent circuit 90 of the storage battery 10 to become saturated.

Figure 4:
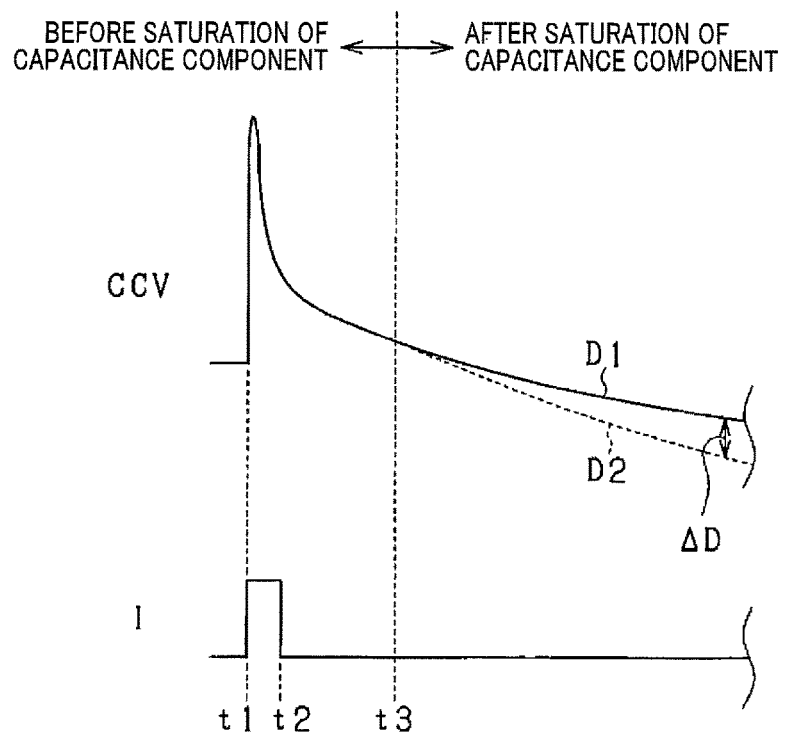
FIG. 4 is a graph schematically illustrating an example of how a CCV based on the equivalent circuit changes over time, and how the CCV actually measured by a voltage sensor changes over time.

Let us consider the case where the storage battery 10 is charged from time t1 to time t2, and thereafter continuously discharged from the time t2 as shown in FIG. 4. While the capacitance components C1 and C2 are unsaturated before the time t3, the change curve, as illustrated by reference character D1 in FIG. 4, of the CCV across the storage battery 10 measured by the voltage sensor 21 over time substantially matches with the change curve, as illustrated reference character D2 in FIG. 4, of the CCV across the storage battery 10 calculated based on the equivalent circuit 90.

However, when the discharge state of the storage battery 10 is continued so that the capacitance components C1 and C2 become saturated at the time t3, the deviation ΔD between the change curve D1 and the change curve D2 gradually increases as time proceeds after the time t3. This may be because a first value of the voltage drop across each of the first RC parallel circuit 73a and the second RC parallel circuit 73b before the capacitance components C1 and C2 become saturated differs from a second value of the voltage drop across the corresponding one of the first RC parallel circuit 73a and the second RC parallel circuit 73b after the capacitance components C1 and C2 become saturated. In particular, the second value after saturation may be lower than the first value before saturation, so that the change curve D1 based on the equivalent circuit 90 is greater than the change curve D2 based on the voltage sensor 21 after saturation of each of the capacitances C1 and C2. This may adversely affect the accuracy of calculating the OCV from the CCV, resulting in adverse effects on the accuracy of the first state of charge SOCv calculated based on the OCV.

To address such an adverse effect, the SOC determination unit 80 according to the embodiment is configured to (1) Determine whether at least one of the capacitance components C1 and C2 is saturated (2) Determine whether the first state of charge SOCv calculated by the SOC calculation unit 70 or the second state of charge SOCi calculated by the second SOC calculation unit 75 is appropriate according to the determination of whether at least one of the capacitance components C1 and C2 is saturated.

For example, the SOC determination unit 80 according to the embodiment is configured to determine whether the capacitance component C2, which has the time constant $\tau 2$ greater than the time constant $\tau 1$ of the capacitance component C1, is saturated.

Figure 5:
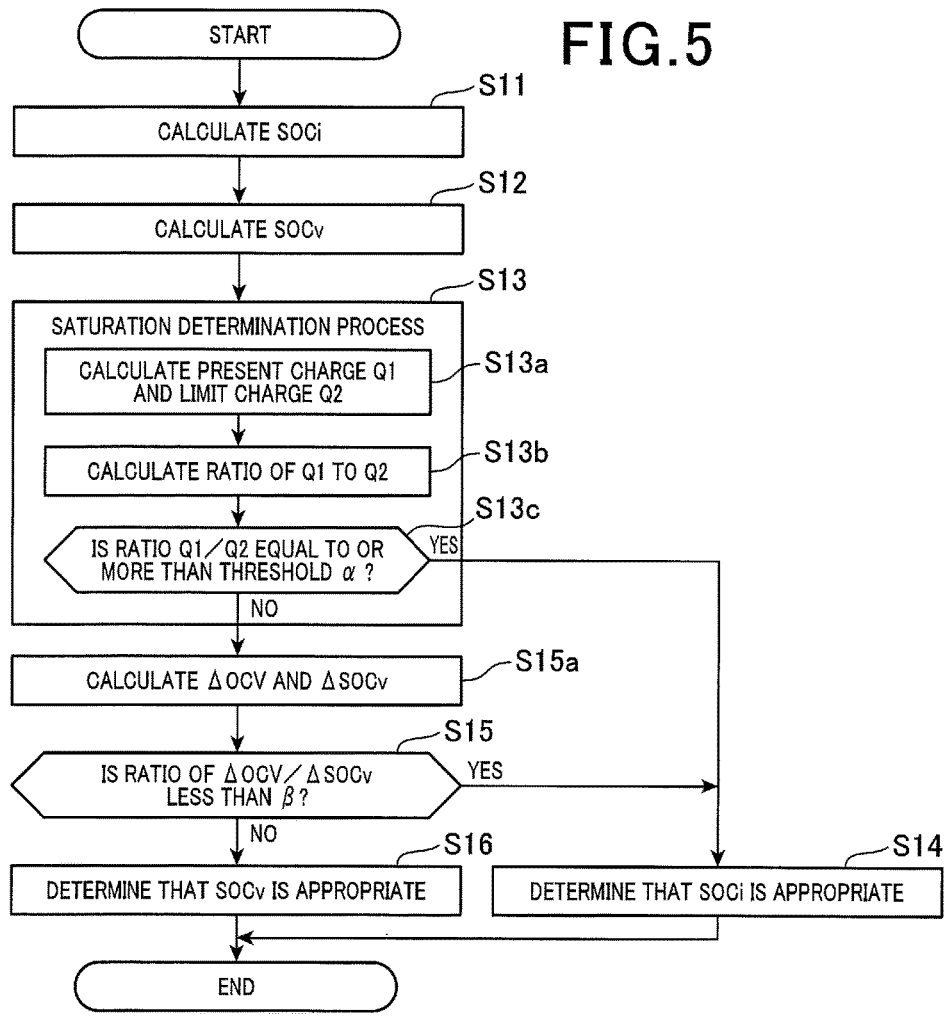
FIG. 5 is a flowchart schematically illustrating an example of an SOC diagnostic routine performed by the controller according to the embodiment of the present disclosure.

Next, the following describes the SOC diagnostic routine according to the embodiment with reference to the flowchart of FIG. 5. The controller 50 cyclically performs a SOC diagnostic task in accordance with the SOC diagnostic routine stored in the storage unit 50b. In other words, the SOC diagnostic routine causes the controller 50 to implement the functions 70, 75, and 80.

When starting a current cycle of the SOC diagnostic routine, the controller 50, which serves as, for example, the second SOC calculation unit 75, calculates the second state of charge SOCi based on the current I measured by the current sensor 22 in accordance with the equations (A) and (1) in step S11.

Next, the controller 50, which serves as, for example, the first SOC calculation unit 70, calculates a value of the OCV across the storage battery 10 based on the equivalent circuit 90, and calculates the first state of charge SOCv based on the value of the OCV across the storage battery 10 in step S12.

Then, the controller 50, which serves as, for example, the SOC determination unit 80, performs a saturation determination process to determine whether the capacitance component C2 is saturated in step S13.

For example, the controller 50 calculates the charge Q1 presently stored in the capacitance component C2 in the current cycle of the SOC diagnostic routine, and calculates a limit charge Q2 for the capacitance component C2 when the capacitance component C2 is saturated in step S13a. For example, in step S13a, the controller 50 calculates the charge Q1 stored in the capacitance component C2 in accordance with the following formula (4), and the limit charge Q2 for the capacitance component C2 when the capacitance component C2 is saturated in accordance with the following equation (5):

$$Q1 = V2 \times C2 \qquad (4)$$

$$Q2 = I \times R2 \times C2 \qquad (5)$$

Following the operation in step S13a, the controller 50 calculates the ratio of the charge Q1 to the limit charge Q2, which is represented as Q1/Q2, in step S13b. Then, the controller 50 determines whether the ratio Q1/Q2 is equal to or more than a predetermined threshold $\alpha$ in step S13c.

Upon determining that the ratio Q1/Q2 is equal to or more than the predetermined threshold $\alpha$, which is expressed by Q1/Q2 ≥ $\alpha$ (YES in step S13c), the controller 50 determines that the capacitance component C2 is saturated, thus determining that the first state of charge SOCv is inappropriate in step S14. Then, the controller 50 determines that the second state of charge SOCi is appropriate in step S14.

Otherwise, upon determining that the ratio Q1/Q2 is less than the predetermined threshold α, which is expressed by Q1/Q2<α (NO in step S13c), the controller 50 determines that the capacitance component C2 is unsaturated.

Following the operation in step S13c, i.e. the operation in step S13, the controller 50 subtracts the value of the OCV calculated in the previous cycle of the SOC diagnostic routine from the present value of the OCV calculated in the current cycle of the SOC diagnostic routine in step S15a. This calculates the amount of change of the OCV, which is represented as ΔOCV in step S15a. In other words, the operation in step S15a calculates the amount of change ΔOCV of the OCV per the interval between the current cycle and the previous cycle; the interval serves as a predetermined unit of time.

In step S15a, the controller 50 also subtracts the value of the first state of charge SOCv calculated in the previous cycle of the SOC diagnostic routine from the present value of the first state of charge calculated in the current cycle of the SOC diagnostic routine. This calculates the amount of change, which is represented as ΔSOCv, of the first state of charge SOCv. In other words, the operation in step S15a calculates the amount of change ΔSOCv of the first state of charge SOCv per the interval, i.e. the predetermined unit of time, between the current cycle and the previous cycle.

Following the operation in step S15a, the controller 50 calculates the ratio of the amount of change ΔOCV to the amount of change ΔSOCv, which is represented as ΔOCV/ΔSOCv, and determines whether the calculated ratio ΔOCV/ΔSOCv is less than a predetermined threshold β in step S15.

Figure 6:
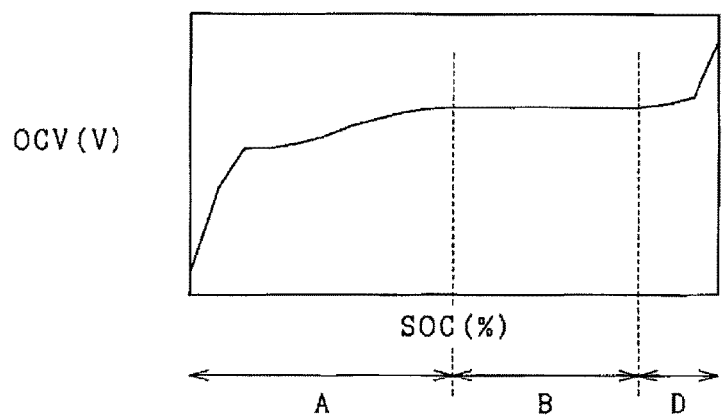
FIG. 6 is a graph schematically illustrating an example of a relationship between an OCV across the storage battery and a first state of change of the storage battery according to the embodiment of the present disclosure.

More specifically, in the OCV-SOCv map information illustrated in FIG. 6, if a value of the OCV is located within a predetermined plateau region, i.e. a predetermined stable output region, B of the first state of charge SOCv, the amount of change ΔOCV is small relative to the amount of change ΔSOCv. This may result in reduction of the accuracy of the first state of charge SOCv calculated based on the OCV, resulting in reduction of the reliability of the first state of charge SOCv calculated based on the OCV.

To avoid the reduction of the reliability of the first state of charge SOCv calculated based on the OCV, the controller 50 according to the embodiment determines whether the ratio of ΔOCV/ΔSOCv is less than the predetermined threshold β as described above. Note that previously measuring the curve of the amount of change ΔOCV within the predetermined plateau region of the first state of charge SOCv can determine a value of the threshold β, which properly distinguishes other regions of the first state of charge SOCv from the plateau region B of the first state of charge SOCv.

Upon determining that the calculated ratio ΔOCV/ΔSOCv is less than the threshold β (YES in step S15), the controller 50 determines that the value of the OCV is located within the predetermined plateau region B of the first state of charge SOCv. Then, the controller 50 determines that the second state of charge SOCi is appropriate regardless of the saturation state of the capacitance component C2 in step S14.

Otherwise, upon determining that the calculated ratio ΔOCV/ΔSOCv is equal to or more than the threshold β (NO in step S15), the controller 50 determines that the value of the OCV is located out of the predetermined plateau region B of the first state of charge SOCv, that is, a region A or region D of the first state of charge SOCv (see FIG. 6). Then, the controller 50 determines that the first state of charge SOCv is appropriate in step S14.

The aforementioned controller 50, which serves as, for example, a main part of the apparatus for calculating the state of charge of the storage battery 10 according to this embodiment, achieves the following advantageous effects.

During charging or discharging of the storage battery 10, it is difficult to directly measure the open circuit voltage (OCV) across the storage battery 10. From this viewpoint, the controller 50 is configured to calculate the OCV across the storage battery 10 using the equivalent circuit 90 of the storage battery 10; the equivalent circuit 90 includes (1) The OCV across the storage battery 10 serving as a power supply voltage therefor (2) The predetermined internal resistance Rs of the storage battery 10

(3) The first RC parallel circuit 73a consisting of the pair of the predetermined polarization resistance R1 and the predetermined capacitance component C1 connected in parallel to each other (4) The second RC parallel circuit 73b consisting of the pair of the predetermined polarization resistance R2 and the predetermined capacitance component C2 connected in parallel to each other.

At that time, continuous charging or discharging of the storage battery 10 may cause, for example, the capacitance component C2 to be saturated, resulting in reduction of the accuracy of calculating the OCV across the storage battery 10 using the equivalent circuit 90.

To address such a problem, the controller 50 determines whether the capacitance component C2 in the equivalent circuit 90 is saturated (see step S13, especially S13c).

Upon determining that the capacitance component C2 is unsaturated (NO in step S13c), the controller 50 determines that the first state of charge SOCv calculated based on the OCV is proper (see step S16). Otherwise, upon determining that the capacitance component C2 is saturated (YES in step S13c), the controller 50 determines that the first state of charge SOCv calculated based on the OCV is improper (see step S14).

This configuration disables the first state of charge SOCv, which is calculated when it is determined that the capacitance component C2 is saturated, from being determined as a proper value. This therefore improves the reliability of the first state of charge SOCv calculated based on the OCV.

When including the second SOC calculation unit 75 for calculating the second state of charge SOCi according to the integration of the measured current I flowing through the storage battery 10, the controller 50 determines that the second state of charge SOCi is proper upon determining that the capacitance component C2 is saturated (see step S14). This obtains the second state of charge SOCi of the storage battery 10 with a higher accuracy even if the capacitance component C2 is saturated. This therefore reduces adverse effects due to the reduction in the accuracy of the first state of charge SOCv of the storage battery 10 calculated based on the OCV.

If the amount of change ΔOCV of the OCV is small relative to the amount of change ΔSOCv of the first state of charge SOCv while the capacitance component C2 is unsaturated, this may result in reduction of the accuracy of the first state of charge SOC calculated based on the OCV. To address such a problem, the controller 50 according to the embodiment determines that the second state of charge SOCi is proper upon determining that the amount of change ΔOCV of the OCV is small relative to the amount of change ΔSOCv of the first state of charge SOCv (see YES in step S15).

This configuration obtains the second state of charge SOCi of the storage battery 10 with a higher accuracy even if the amount of change ΔOCV of the OCV is small relative to the amount of change ΔSOCv of the first state of charge SOCv. This therefore reduces adverse effects due to the reduction in the accuracy of the first state of charge SOCv of the storage battery 10 calculated based on the OCV even if the amount of change ΔOCV of the OCV is small relative to the amount of change ΔSOCv of the first state of charge SOCv.

The controller 50 according to the embodiment reliably determines whether the capacitance component C2 is saturated according to whether the ratio of the charge Q1 stored in the capacitance component C2 to the limit charge Q2 previously determined for the capacitance component C2 is equal to or more than the threshold α.

The controller 50 according to the embodiment selects the capacitance component C2 in the capacitance components C1 and C2; the time constant τ1 is greater than the time constant τ2 (see step S13). Then, the controller 50 determines whether the capacitance component C2 in the equivalent circuit 90 is saturated (see step S13c).

This configuration enables time required for the capacitance component C2 to become saturated to be greater than time required for the capacitance component C1 to become saturated. This therefore increases the frequency of use for the first state of charge SOCv of the storage battery 10 as a parameter indicative of the electrochemical behavior of the storage battery 10.

Note that it is usually preferable to use the first state of charge SOCv of the storage battery 10 as a parameter indicative of the electrochemical behavior of the storage battery 10 rather than the second state of charge SOCi of the storage battery 10. This is because the first state of charge SOCv is usually higher in accuracy than the second state of charge SOCi while the capacitance components C1 and C2 are unsaturated with the OCV being located out of the predetermined plateau region of the first state of charge SOCv.

Modifications

The present disclosure is not limited to the embodiment described above. The above embodiment can be freely modified within the scope of the present disclosure. In the modifications, descriptions of like parts or elements between the embodiment and the modifications, to which like reference characters are assigned, are omitted or simplified to avoid redundant description.

The embodiment represents the polarization voltage Vp in the equivalent circuit 90 based on the first RC parallel circuit 73a with the time constant τ1 expressed as τ1=R1·C1 and the second RC parallel circuit 73b with the time constant τ2 expressed as τ2=R2·C2 different from the time constant τ1. The present disclosure is however not limited to the configuration. Specifically, the polarization voltage Vp in the equivalent circuit 90 can be represented based on at least one pair of a polarization resistance and a capacitance, i.e. an electric double layer capacitance, connected in parallel to each other.

As described above, increasing the number of RC parallel circuits, which have individually time constants different from each other, enables the electrochemical behavior of the storage battery 10 to be estimated with higher accuracy although the calculation load of the controller 50 increases.

In step S13, the controller 50 of the embodiment selects the capacitance component C2 in the capacitance components C1 and C2; the time constant τ1 is greater than the time constant τ2. Then, the controller 50 determines whether the capacitance component C2 in the equivalent circuit 90 is saturated.

In other words, it is assumed that the equivalent circuit 90 according to the embodiment includes a plurality of RC parallel circuits, each of which is comprised of a polarization resistance and an electric double layer capacitance component. The plurality of RC parallel circuits have individual time constants different from each other.

Under this assumption, the controller 50 of the embodiment selects a capacitance component in all the capacitance components; the time constant of the selected capacitance component is the greatest in all the time constants of the capacitance components. Then, the controller 50 determines whether the selected capacitance component in the equivalent circuit 90 is saturated. The present disclosure is however not limited to the configuration of the controller 50.

The equivalent circuit 90 according to each of the first and second modifications of the embodiment also includes a plurality of RC parallel circuits, each of which is comprised of a polarization resistance and an electric double layer capacitance component. The plurality of RC parallel circuits have individual time constants different from each other.

At that time, before the operation in step S13a, the controller 50 according to the first modification calculates an average value Cave in the electrical double layer capacitance components of the plurality of RC parallel circuits in step S20. For example, if the plurality of RC parallel circuits consists of the first and second RC parallel circuits 73a and 73b, the controller 50 calculates the average value Cave in the capacitance components C1 and C2, which is expressed by Cave=(C1+C2)/2.

Figure 7:
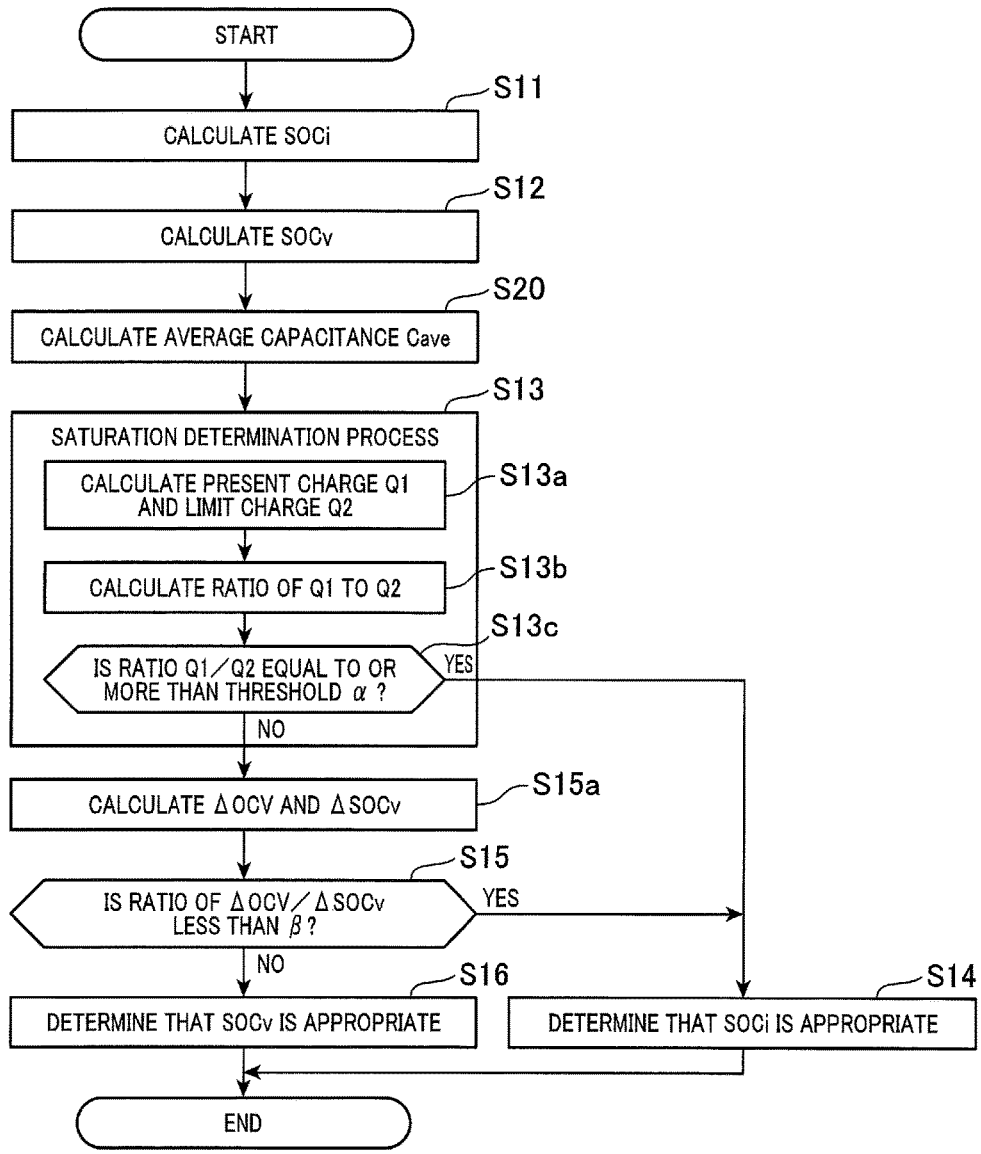
FIG. 7 is a flowchart schematically illustrating an example of an SOC diagnostic routine performed by the controller according to a first modification of the embodiment.

Then, the controller 50 performs the operations in steps S13a to S13c using the average value, i.e. the average capacitance component Cave, in place of the capacitance component C2 (see FIG. 7).

Figure 8:
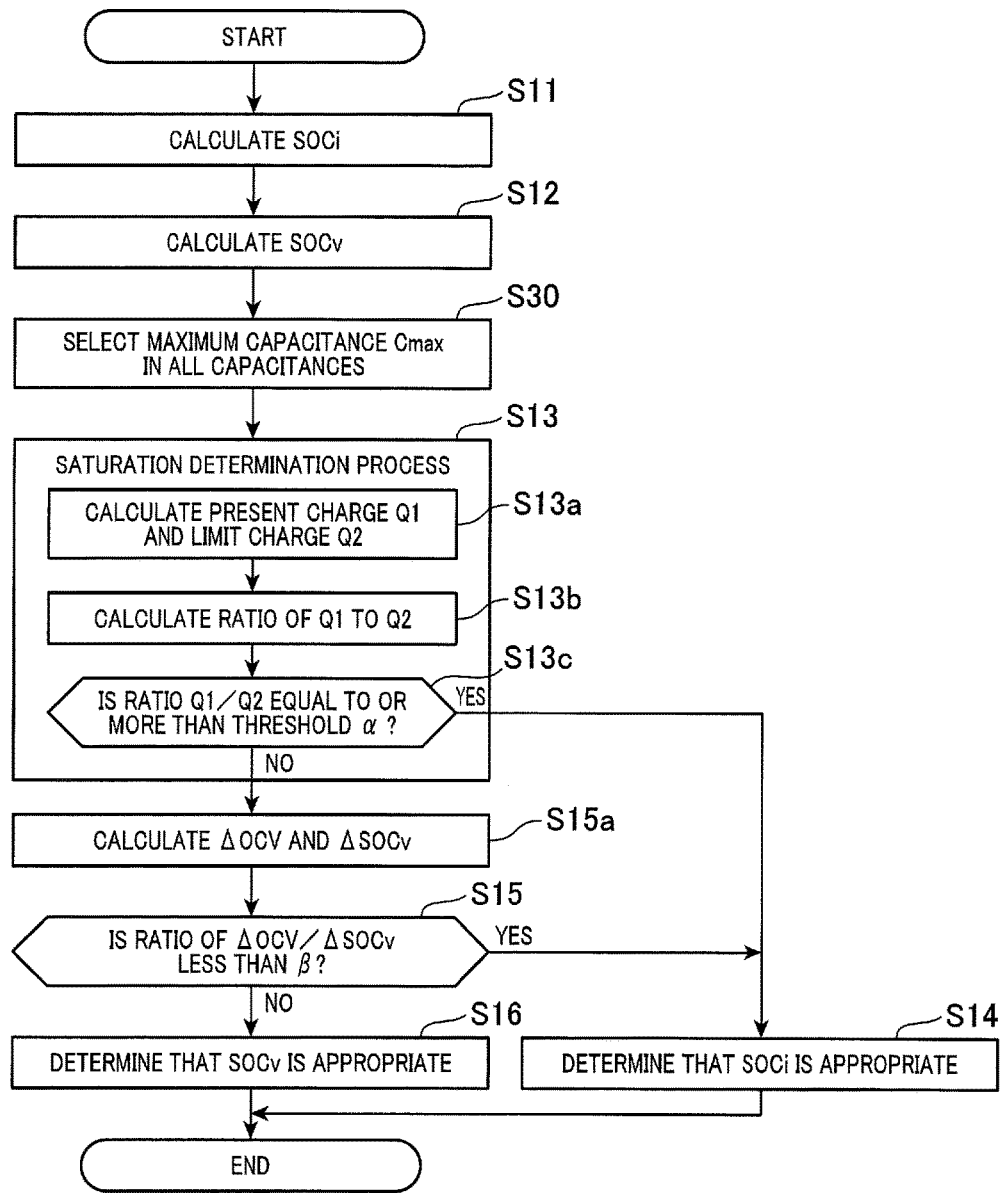
FIG. 8 is a flowchart schematically illustrating an example of an SOC diagnostic routine performed by the controller according to a second modification of the embodiment.

Additionally, before the operation in step S13a, the controller 50 according to the second modification selects, as a maximum capacitance component, one capacitance component Cmax in the electrical double layer capacitance components of the plurality of RC parallel circuits in step S20 at the current cycle of the SOC diagnostic routine. The selected maximum capacitance component Cmax has the charge stored therein, which is the greatest in all the charges stored in the electrical double layer capacitance components of the plurality of RC parallel circuits. Then, the controller 50 performs the operations in steps S13a to S13c using the maximum capacitance component Cmax in place of the capacitance component C2 (see FIG. 8).

In step S13, the controller 50 can determine whether the capacitance component C2 is saturated based on a comparison in magnitude between the charge Q1 and the limit charge Q2. In step S13, the controller 50 also can determine whether the capacitance component C2 is saturated based on how the charge Q1 changes. This is because the change curve of the charge Q1 enables the saturation of the capacitance component C2 to be easily understood.

The second SOC calculation unit 75 is configured to calculate the second state of charge SOCi based on integration of values of the current I measured by the current sensor 22, but the present disclosure is not limited thereto. Specifically, the second SOC calculation unit 75 can include, for example, map information, which is similar to the map information illustrated in FIG. 6, indicative of the correlations between the second state of charge SOCi and the current I flowing through the storage battery 10. That is, the second SOC calculation unit 75 refers to the map information indicative of the correlations between the second state of charge SOCi and the current I using a value of the current I presently measured by the current sensor 22. The second SOC calculation unit 75 extracts, based on the results of the reference to the map information, a value of the second state of charge SOCi matching with the value of the current I presently measured by the current sensor 22.

The controller 50 according to the embodiment includes the first SOC calculation unit 70 and the second SOC calculation unit 75, and determines whether the first state of charge SOCv calculated by the first SOC calculation unit 70 or the second state of charge SOCi calculated by the second SOC calculation unit 75 is appropriate. The present disclosure is however not limited to the configuration.

Specifically, the controller 50 can include the first SOC calculation unit 70 without including the second SOC calculation unit 75. In this modification, upon determining that the ratio Q1/Q2 is equal to or more than the predetermined threshold α (YES in step S13c), the controller 50 determines that the capacitance component C2 is saturated, thus determining that the first state of charge SOCv is inappropriate in step S14. Then, in step S14, the controller 50 can disable the first SOC calculation unit 70 from calculating the first state of charge SOCv according to the calculated OCV, or can disable the first state of charge SOCv calculated by the first SOC calculation unit 70. This enables the first state of charge SOCv, which have been calculated while the capacitance component C2 is unsaturated, to be used.

In step S13, the controller 50 of the embodiment determines whether the capacitance component C2 is saturated as a function of at least the charge Q1 stored in the capacitance component C2 in the current cycle of the SOC diagnostic routine. The present disclosure is however not limited to the configuration of the controller 50.

Specifically, the controller 50 can determine whether the capacitance component C2 is saturated as a function of an electrical parameter associated with at least the charge Q1 stored in the capacitance component C2.

Figure 9:
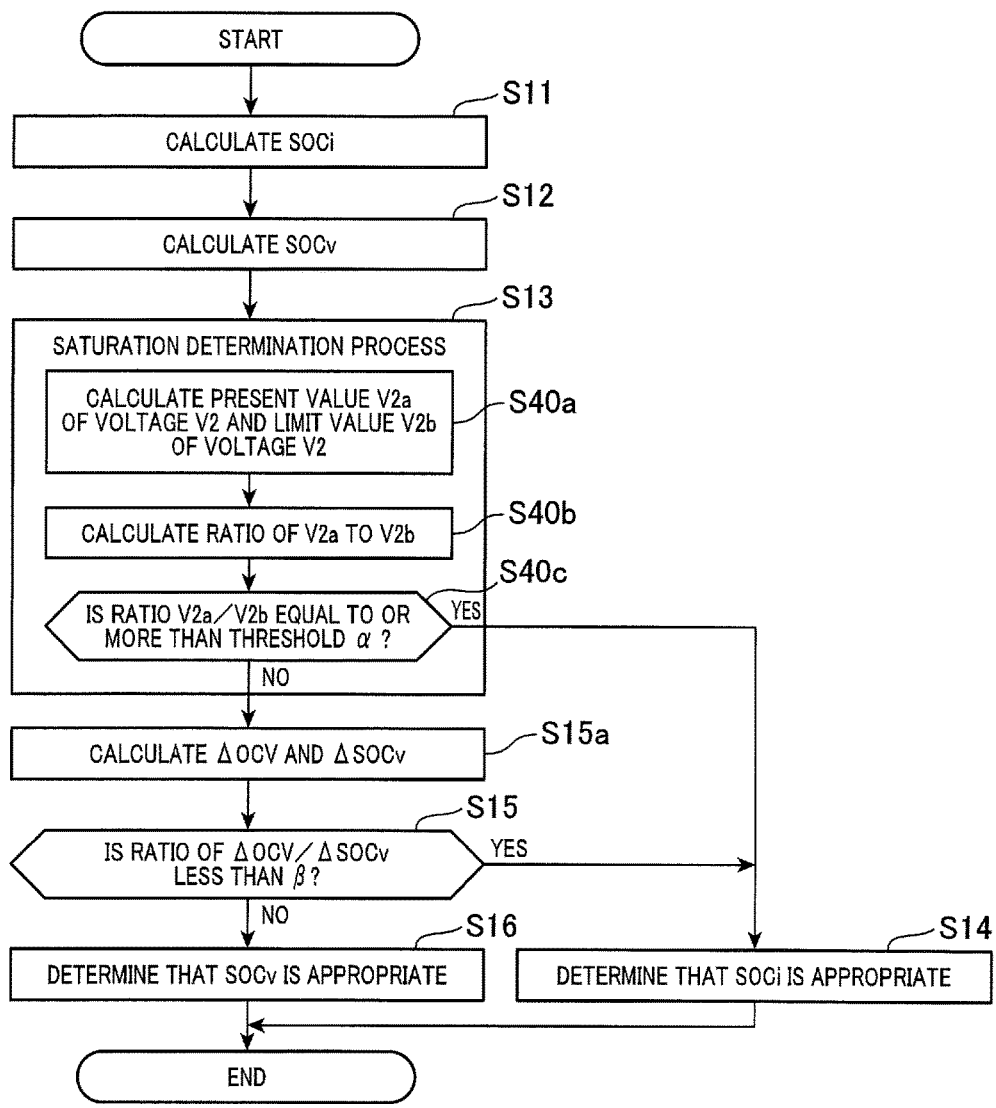
FIG. 9 is a flowchart schematically illustrating an example of an SOC diagnostic routine performed by the controller according to a third modification of the embodiment.

For example, in place of step S13, the controller 50 according to the third modification calculates a value V2a of the voltage V2 across the second RC parallel circuit 73b in the current cycle of the SOC diagnostic routine according to the current I, the capacitance component C2, and the polarization resistance R2 in step S40a of FIG. 9. In step S40a, the controller 50 also calculates a limit value V2b of the voltage V2 for the voltage V2 in step S40a; the limit value V2b is calculated based on the current I measured by the current sensor 22, the capacitance component C2, and the limit charge Q2.

Following the operation in step S40a, the controller 50 calculates he ratio of the value V2a to the limit value V2b, which is represented as V2a/V2b, in step S40b. Then, the controller 50 determines whether the ratio V2a/V2b is equal to or more than a predetermined threshold γ in step S40c. This also enables whether the capacitance component C2 is saturated to be diagnosed.

The SOC diagnostic routine eliminates steps S15a and S15 therefrom. The modified SOC diagnostic routine causes the controller 50 to determine that the first state of charge SOCv is appropriate in step S16 when it is determined that the capacitance component C2 is unsaturated in step S13c, or the second state of charge SOCi is appropriate in step S16 when it is determined that the capacitance component C2 is saturated in step S13c.

The storage battery 10 is not limited to a lithium-ion secondary battery. For example, a lead storage battery or a nickel-hydrogen storage battery can be employed for the storage battery 10.

While the illustrative embodiment of the present disclosure has been described herein, the present disclosure is not limited to the embodiment described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. An apparatus for calculating a state of charge of a storage battery, the apparatus comprising:
   an open-circuit voltage calculator configured to measure a close circuit voltage across an equivalent circuit of a storage battery, and calculate an open circuit voltage across the storage battery based on the measured close circuit voltage, the equivalent circuit, and a current flowing through the storage battery, the equivalent circuit simulating an electrochemical behavior of the storage battery,
   the equivalent circuit comprising the open circuit voltage as a power supply voltage and a predetermined internal impedance connected in series to the power supply voltage, the internal impedance including a predetermined capacitance;
   a calculator configured to calculate a state of charge of the storage battery as a function of the open circuit voltage calculated by the open-circuit voltage calculator;
   a determiner configured to determine whether the capacitance is saturated as a function of an electrical parameter associated with a charge stored in the capacitance; and
   a diagnosing unit configured to diagnose whether the state of charge of the storage battery calculated by the calculator is appropriate according to whether the capacitance is saturated.

2. The apparatus according to claim 1, wherein the internal impedance includes:
   an internal resistance of the storage battery; and
   an RC parallel circuit connected in series to the internal resistance, the RC parallel circuit comprising a polarization resistance of the storage battery, and the capacitance connected in parallel to the polarization resistance.

3. The apparatus according to claim 1, wherein the diagnosing unit is configured to diagnose that:
   the state of charge of the storage battery calculated by the calculator is appropriate upon the capacitance being determined to be unsaturated; or
   the state of charge of the storage battery calculated by the calculator is inappropriate upon the capacitance being determined to be saturated.

4. The apparatus according to claim 1, wherein the calculator serves as a first calculator configured to calculate the state of charge of the storage battery as a first state of charge of the storage battery, the apparatus further comprising:
   a second calculator configured to calculate a second state of charge of the storage battery based on the current flowing through the storage battery, the diagnosing unit being configured to diagnose that:
the first state of charge of the storage battery calculated by the first calculator is appropriate upon the capacitance being determined to be unsaturated; or
the second state of charge of the storage battery calculated by the second calculator is appropriate upon the capacitance being determined to be saturated.

5. The apparatus according to claim 1, further comprising:
a first change calculator configured to calculate a first amount of change of the open circuit voltage per a predetermined unit of time;
a second change calculator configured to calculate a second amount of change of the first state of charge of the storage battery per the predetermined unit of time; and
a comparator configured to compare the first amount of change of the open circuit voltage with the second amount of change of the first state of charge of the storage battery upon the capacitance being determined to be unsaturated,
wherein the diagnosing unit is further configured to diagnose whether the first state of charge of the storage battery calculated by the calculator is appropriate according to a result of the comparison of the comparator.

6. The apparatus according to claim 1, wherein:
the determiner comprises:
a first charge calculator configured to calculate, as the electrical parameter, a first charge presently stored in the capacitance according to the internal impedance and the current flowing through the storage battery;
a second charge calculator configure to calculate a second charge for the capacitance according to the internal impedance and the current lowing through the storage battery, the second charge being a charge for the capacitance when the capacitance is saturated;
a ratio calculator configured to calculate a ratio of the first charge to the second charge; and
a saturation determiner configured to determine whether the capacitance is saturated as a function of the ratio of the first charge to the second charge calculated by the ratio calculator.

7. The apparatus according to claim 1, wherein:
the determiner comprises:
a first voltage calculator configured to calculate, as the electrical parameter, a first voltage across the capacitance according to the internal impedance and the current flowing through the storage battery;
a second voltage calculator configure to calculate a second voltage across the capacitance according to the internal impedance and the current flowing through the storage battery, the second voltage being a charge across the capacitance when the capacitance is saturated;
a ratio calculator configured to calculate a ratio of the first voltage to the second voltage; and
a saturation determiner configured to determine whether the capacitance is saturated as a function of the ratio of the first voltage to the second voltage calculated by the ratio calculator.

8. The apparatus according to claim 1, wherein:
the internal impedance includes:
an internal resistance of the storage battery; and
a plurality of RC parallel circuits connected in series to the internal resistance,
each of the plurality of RC parallel circuits comprising a polarization resistance of the storage battery, and a capacitance component, the capacitance components of the plurality of RC parallel circuits serve as the capacitance,
the plurality of RC parallel circuits individually having time constants different from each other,
the determiner being configured to:
select one of the capacitance components in the plurality of RC parallel circuits, the time constant of the selected capacitance being the greatest in all the time constants of the capacitance components in the plurality of RC parallel circuits; and
determine whether the selected capacitance component is saturated as a function of the electrical parameter associated with a charge stored in the selected capacitance component.

9. The apparatus according to claim 1, wherein:
the internal impedance includes:
an internal resistance of the storage battery; and
a plurality of RC parallel circuits connected in series to the internal resistance,
each of the plurality of RC parallel circuits comprising a polarization resistance of the storage battery, and a capacitance component, the capacitance components of the plurality of RC parallel circuits serve as the capacitance,
the determiner being configured to:
calculate, as an average capacitance component, an average value of the capacitance components in the plurality of RC parallel circuits; and
determine whether the average capacitance component is saturated as a function of the electrical parameter associated with a charge stored in the average capacitance component.

10. The apparatus according to claim 1, wherein:
the internal impedance includes:
an internal resistance of the storage battery; and
a plurality of RC parallel circuits connected in series to the internal resistance,
each of the plurality of RC parallel circuits comprising a polarization resistance of the storage battery, and a capacitance component, the capacitance components of the plurality of RC parallel circuits serve as the capacitance,
the determiner being configured to:
select, as a maximum capacitance component, one of the capacitance components in the plurality of RC parallel circuits, the selected maximum capacitance component being the greatest in all the capacitance components in the plurality of RC parallel circuits; and
determine whether the maximum capacitance component is saturated as a function of the electrical parameter associated with a charge stored in the maximum capacitance component.

* * * * *